(12) United States Patent
Shabalin et al.

(10) Patent No.: US 7,241,360 B2
(45) Date of Patent: Jul. 10, 2007

(54) METHOD AND APPARATUS FOR NEUTRALIZATION OF ION BEAM USING AC ION SOURCE

(75) Inventors: Andrew Shabalin, Fort Collins, CO (US); Colin Quinn, Fort Collins, CO (US); Michael Kishinevski, Manalapay, NJ (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 266 days.

(21) Appl. No.: 10/126,132

(22) Filed: Apr. 19, 2002

(65) Prior Publication Data

US 2003/0196602 A1 Oct. 23, 2003

(51) Int. Cl.
*H01L 21/306* (2006.01)
*C23C 16/00* (2006.01)
*C23C 14/00* (2006.01)
*H01J 7/24* (2006.01)

(52) U.S. Cl. ............................ 156/345.39; 118/723 FI; 118/723 CB; 204/298.04; 204/298.36; 315/111.81

(58) Field of Classification Search ......... 118/723 CB, 118/723 FI; 315/111.81; 156/345.39, 345.4; 204/298.04, 298.06, 298.08, 298.41, 298.36
See application file for complete search history.

(56) References Cited

U.S. PATENT DOCUMENTS

| | | | | |
|---|---|---|---|---|
| 5,285,346 A | * | 2/1994 | Davies et al. ............... | 361/103 |
| 5,993,613 A | * | 11/1999 | Manley ................. | 204/192.12 |
| 6,153,067 A | * | 11/2000 | Maishev et al. ....... | 204/298.04 |

* cited by examiner

*Primary Examiner*—Luz Alejandro-Mulero
(74) *Attorney, Agent, or Firm*—Benjamin Hudson, Jr.; John D. Pirnot

(57) ABSTRACT

There is provided by this invention a unique ion source for depositing thin films on a substrate in a vacuum chamber that neutralizes the positive electric charges that develop on the substrate and vacuum chamber apparatus that may cause arcing and degradation of the film deposition. A power supply with a reversing voltage waveform is utilized that neutralizes the electric charge on the substrate and the vacuum chamber apparatus. A power supply applies an ac voltage to the anode of the ion source and a rectified ac voltage to the cathode. The ground terminal of the power supply is connected to the vacuum chamber. The rectifying circuit is comprised of zener diodes that clamp the voltage in the circuit from spikes during plasma ignition and a capacitor connected to negatively bias the cathode when there is no plasma discharge.

6 Claims, 3 Drawing Sheets

METHOD AND APPARATUS FOR NEUTRALIZATION OF ION BEAM USING AC ION SOURCE

BACKGROUND OF THE INVENTION

1. Field of the Invention

Generally, the invention pertains to the field of vacuum thin film deposition onto substrates using ion sources and modifying properties of substrates by ion beam treatment. Specifically, the invention focuses upon a new and improved method and apparatus for providing the supply of electrons onto a thin film substrate for neutralization of electric charge brought onto the surface of said substrate and other surfaces of the apparatus by the ion beam radiating from a closed drift ion source.

2. Description of the Prior Art

When a substrate is exposed to an ion beam, a need arises to close the electrical current path, or in another words to neutralize the electrical charge brought with the ions onto the substrate surface as well as onto other surfaces of the apparatus. This need is especially apparent for insulating substrates, but even conductive substrates as well as other surfaces of the apparatus frequently have poorly conducting inclusions or thin films on them. If those films or inclusions are not discharged, the accumulated charge may lead to an electrical breakdown and an onset of an arc that may introduce defects at the substrate surface. Although similar charging problems exist in other vacuum processing fields, such as in reactive magnetron sputtering, the ion beam processing is an entirely different technology. It operates on different principles, at different voltage levels, different polarities, and even with charged particles hitting different surfaces and so is not thought of as analogous. Ion beam etching of silicon oxide is one example of an ion beam process that is addressed by present invention. The invention specifically pertains to closed drift ion sources, such as the LIS and MCIS series manufactured by Advanced Energy Industries of Fort Collins, Colo. These closed drift ion sources are quickly finding new applications due to their rugged design and low maintenance. Solving neutralization problems for these sources opens markets for these types of supplies.

Most ion sources incorporate some kind of an electron emitter device, commonly referred to as a neutralizer to supply electrons onto a substrate surface as taught, for instance, in a reference book, entitled "Handbook of Ion Beam Processing Technology" edited by Jerome J. Cuomo, Stephen M. Rossnagel and Harold R. Kaufman (Noyes Publications), hereby incorporated by reference. The electron emitter frequently doubles as a neutralization device, or a second emitter sometimes is used specifically for neutralization.

Two basic types of electron emitters are being commonly used, a hot filament and a hollow cathode. A significant problem with the use of hot filament thermionic electron emitters is that the operational lifetime of the emitters can be very limited, often less than 100 hours. This may be especially true when reactive gases, such as oxygen, are present in the ion source. Similarly, hollow cathode electron emitters can have a lifetime of about 1000 hours as disclosed by U.S. Pat. Nos. 3,156,090; 3,913,320; 3,952,228; 3,956,666; and 3,969,646, each hereby incorporated by reference. An additional problem with an electron emitter neutralizer is that it can introduce additional complexity to the system, and perhaps, a need to align the position of the neutralizer so that it has good coupling with the plasma but does not stand in the way of the ion beam. Yet another additional problem with an electron emitter neutralizer can be a non-uniformity that it may introduce onto the process, especially with wide aperture beams. To mitigate this non-uniformity several neutralizers have sometimes been used.

Additionally, U.S. Pat. No. 5,973,447 issued to L. J. Mahoney et al disclosed an ion source that utilizes a separate self-sustaining cathode 74 with dc power sources 84 and 86 to generate electrons. This type of electron emitter is typical of the complexity that some designs add to the process.

Closed-drift ion sources, like the LIS series and the MCIS series manufactured by Advanced Energy Industries of Fort Collins Colo., do not require an electron emitter for their operation. It has been discovered that sufficient electron emission can be obtained by connecting the power source directly to the anode of the ion source using the ion source housing as the cathode. This can greatly expand the application range by making the source design reliable and rugged and having long maintenance-free operation time. However, in certain thin film applications that are not tolerant to ion beam charging there can be a great need for a way to neutralize the substrate surface without compromising the advantages of the ion source design.

For grid ion sources a different method of thin film neutralization, not requiring a hot electron emitter, was proposed by D. Korzec, T. Kebler, H. M. Keller and J. Engelmann in "Filamentless Neutralization of Broad Ion Beams", in the Journal of Vacuum Science and Technology, B9 (1991), pgs 3084-3089. According to this publication, a bipolar pulsing of grid voltages can make the ion source work as an electron source during the reverse polarity part of every pulse. Since thin films can have high capacitance, the voltage on the surface may not change significantly during the pulse so the film surface can be kept at low potential if the pulse frequency is high enough. This method did not seem to be applicable to closed drift ion sources because a closed drift source cannot sustain its discharge with reversed bias voltage. The reason for this is that magnetic field lines in the closed drift ion source usually must have both ends terminating at the cathode so electrons cannot arrive from cathode to anode along the magnetic field lines. However, almost always all magnetic field lines originating at the anode terminate at the cathode, so reverse bias could force electrons to the positive side of the source before they can make any ionization. Moreover, a shortened duty cycle appeared to cause reduction of the ion source throughput and this alone could make this method commercially unattractive.

SUMMARY OF THE INVENTION

The present invention applies a new technique to power a closed drift ion source, based on an assumption that normal discharge during the positive part of the power supply waveform will be sustained after the application of a reverse voltage and thus allow generation of as much electron current as necessary to neutralize the substrate. The potential of the substrate is always positive and the ion source is insulated from ground. During the positive cycle there is a positive voltage on the anode and the cathode has a zero potential. During the negative cycle, the anode and cathode are both negative, and the entire ion source works like a typical magnetron, emitting electrons. Discharge continues during this time between the ion source and grounded walls of the vacuum chamber; electrons are replenished, creating as much neutralizing electron current as necessary.

DETAILED DESCRIPTION OF THE PREFERRED EMBODIMENTS

In one embodiment, the present invention uses the conductivity of a transient glow plasma that accompanies the ion beam in the vacuum chamber to neutralize positive electrical charge on a substrate and other apparatus surfaces. To accomplish that, a special ion source power supply is used that periodically reverses the polarity for a segment of time, biasing all or some parts of the ion source negatively relative to the substrate and the vacuum chamber. During this reverse bias cycle the plasma potential swings toward negative polarity and this can allow electrons from the plasma to reach surfaces that need to be neutralized.

Although relying upon fundamentally different principles, problems addressed in the field of magnetron sputtering can illustrate some of the advantages now available in the field of ion beam processing such as in closed drift ion sources, among others. In magnetron sputtering apparatus arcing was a severe problem that limited the throughput and reduced quality of the product, especially during reactive sputtering when sputtered cathode material reacts with reactive gas in the vacuum chamber, such as oxygen to produce dielectric films on the substrate. The arcing was greatly reduced or eliminated by using a pulsed DC power supply, such as in U.S. Pat. No. 5,427,669 by Drummond of Advanced Energy Industries, Inc., hereby incorporated by reference. Unlike a magnetron application, an ion source apparatus according to the present invention has a completely different polarity, among other differences. While in the magnetron film deposition apparatus a magnetron cathode is biased negatively during the active part of the cycle and positive during the neutralization part of the cycle, in the ion source apparatus the power supply polarity is inverse, because ion acceleration requires positive voltage on the ion source anode, and neutralization occurs when output voltage is negative. The commercial advantages, however, can be just as significant in this field.

Figure 1:
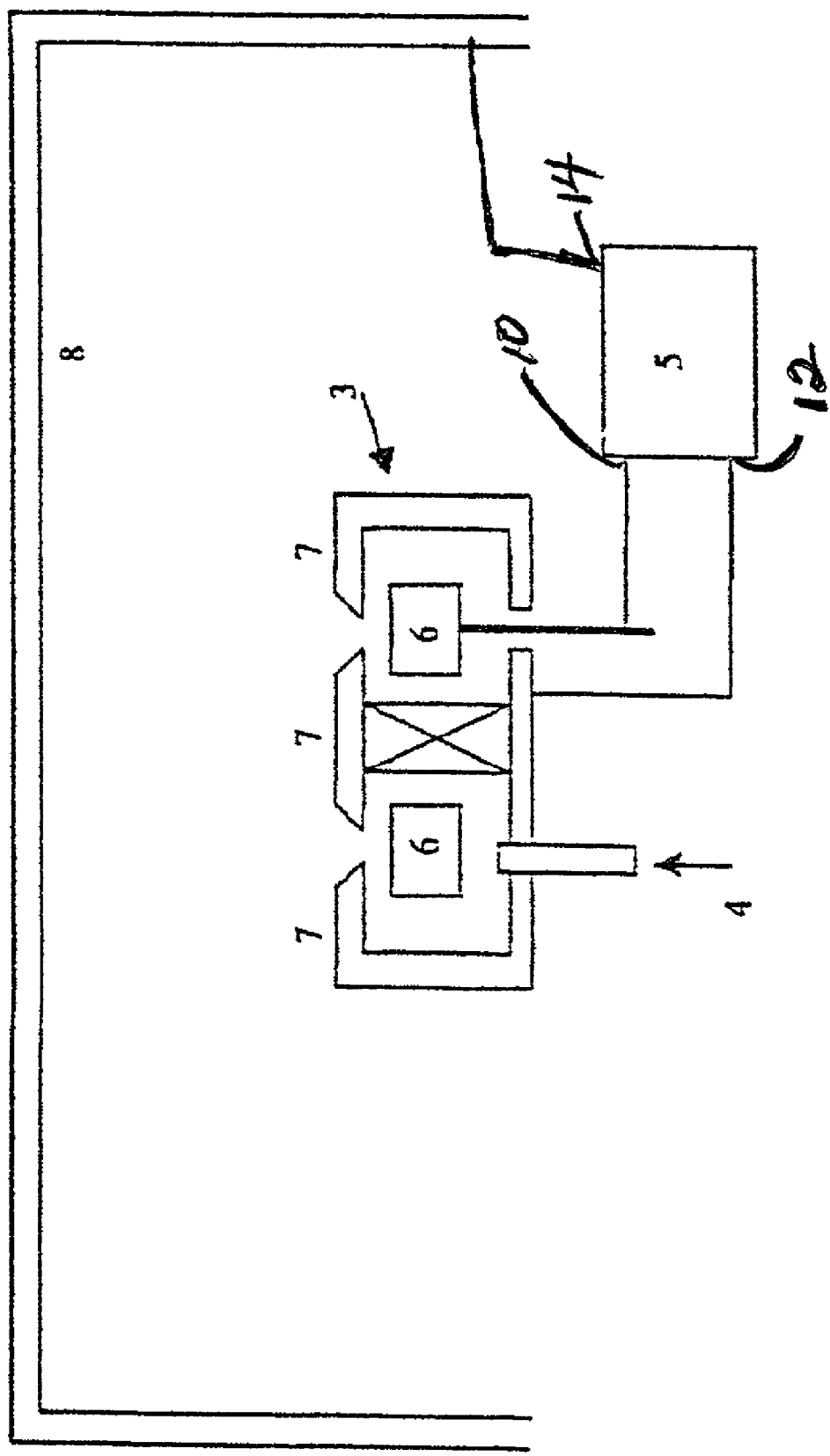
FIG. 1 illustrates a preferred embodiment applied to a closed drift ion source driven by an ac power source.

To improve neutralization and facilitate the plasma ignition the power provides an ac voltage that is applied to the anode. The ac voltage is applied to the anode at a frequency of approximately 375 kHz and a recitifed unfiltered ac voltage is applied to the cathode. The power supply is also connected to the vacuum chamber, which is most commonly connected to ground. This embodiment is schematically shown in FIG. 1. A closed drift ion source (3), such as the MCIS series manufactured by Advanced Energy Industries is used in this embodiment. The power supply (5) has one output terminal 10 connected to the anode (6) of the ion source and the other output terminal 12 to the ion source housing which serves as the cathode (7). A third terminal 14 connects the power supply to the vacuum chamber housing 8. Process gas is supplied to the ion source (3) via input port (4).

Figure 2:
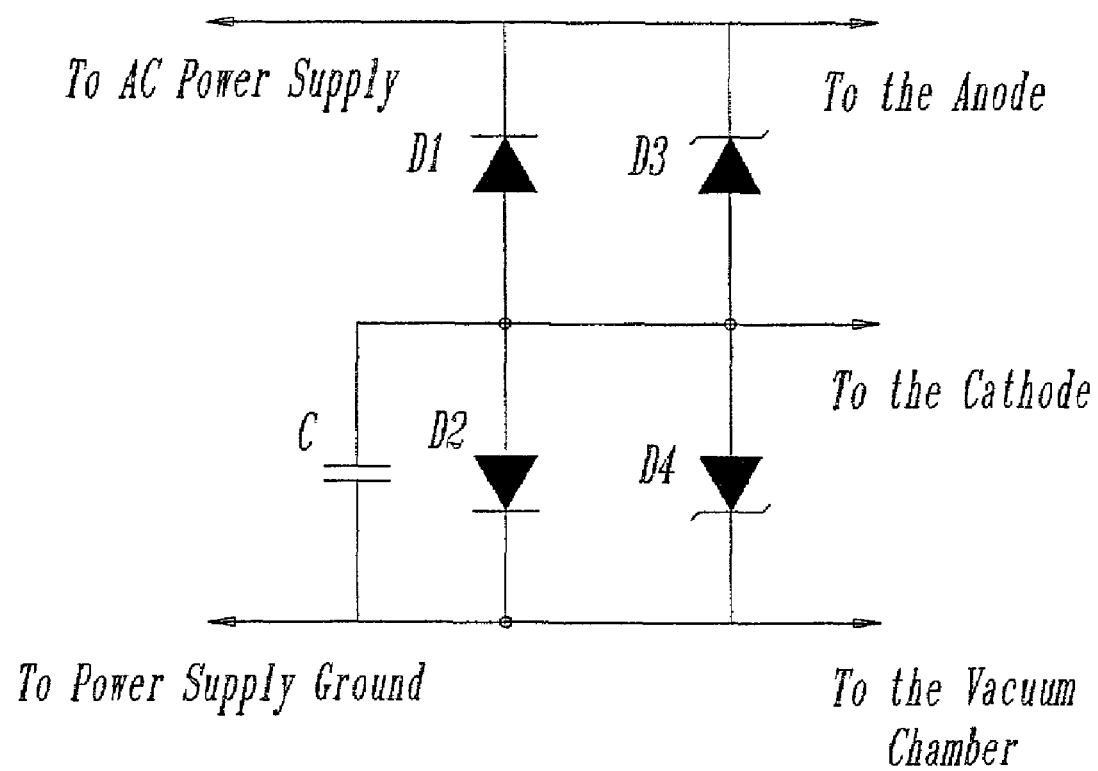
FIG. 2 illustrates the circuit for supplying power to the anode and cathode.

The power supply 5 supplies the ac voltage and the rectified ac voltage to the anode and cathode, respectively, by the circuit shown in FIG. 2. The circuit shows three outputs for the ion source, one for supplying an ac voltage to the anode, a second for supplying a rectified ac to the cathode, and a third connection to the vacuum chamber. A sine wave medium frequency power supply can be used, such as the PE-II manufactured by Advanced Energy Industries. As one can see, the anode is connected directly to the ac power supply. Diodes D1 and D2 form the cathode voltage. Zener diodes D3 and D4 protect diodes D1 and D2 from voltage spikes, which could happen during plasma ignition or if the plasma in the source becomes unstable. Capacitor C facilitates ignition by biasing the cathode negatively when there is no discharge. When plasma is ignited, capacitor C has no influence on the circuit operation.

Figure 3:
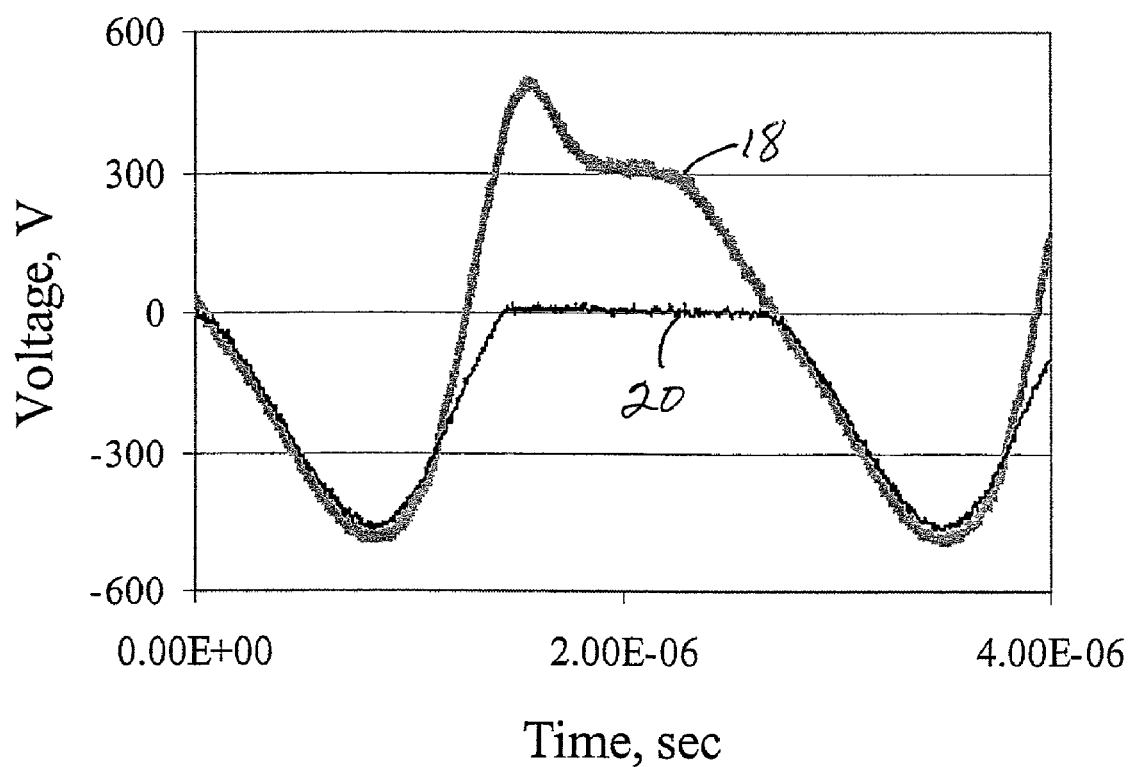
FIG. 3 illustrates the anode and cathode voltage waveforms for ac operation of the closed drift ion source.

FIG. 3 illustrates the anode and cathode voltages for AC operation of the closed drift ion source in the diffuse beam mode. Curve 18 represents the anode voltage and curve 20 represents the cathode voltage. During the positive cycle, there is a positive voltage on the anode, and the cathode has zero potential. At this time, the ion source works like a DC ion source, emitting ions. During the negative cycle, the anode and cathode are both negative, and the entire ion source works like a typical magnetron, emitting electrons. Discharge continues during this time between the ion source and grounded walls of the vacuum chamber; electrons are replenished, creating as much neutralizing electron current as necessary. Also, because transition between positive and negative voltages is very fast and there is no dead time, the plasma doesn't decay and the discharge reignites quickly every cycle and without a high voltage spike. Using this method for oxygen, we were able to achieve a floating potential of the substrate to as low as 6 volts.

It is to be understood that the scope of present invention is not limited to particular ion sources, but can work with a wide variety of ion sources. Further, as can be easily understood from the foregoing, the basic concepts of the present invention may be embodied in a variety of ways. It involves both closed drift ion source neutralization techniques, and closed drift ion source power supply techniques, as well as devices to accomplish the appropriate power supply arrangements. In this application, the neutralization techniques are disclosed as part of the results shown to be achieved by the various devices described and as steps, which are inherent to utilization. They are simply the natural result of utilizing the devices as intended and described. In addition, while some devices are disclosed, it should be understood that these not only accomplish certain methods but also can be varied in a number of ways. Importantly, as to all of the foregoing, all of these facets should be understood to be encompassed by this disclosure.

We claim:

1. An apparatus for treating a substrate, comprising:
    a) a vacuum chamber;
    b) an ion source disposed in the vacuum chamber, the ion source comprising a cathode having a magnetic gap and an anode adjacent to the magnetic gap;
    c) a first power supply connection that applies a positive voltage to the anode during a first portion of an AC power cycle and a negative voltage to the anode during a second portion of the AC power cycle, the positive voltage causing the anode to emit ions that strike a substrate disposed in the vacuum chamber; and
    d) a second power supply connection that applies a negative voltage to the cathode during a second portion of the AC power cycle, the negative voltages applied to the anode and cathode causing the ion source to emit electrons that strike the substrate, thereby neutralizing positive charges on the substrate.

2. The apparatus of claim 1 wherein the ion source is a closed drift ion source.

3. The apparatus of claim 1 wherein the positive voltage and negative voltages are applied by an AC power supply.

4. The apparatus of claim 3 wherein the AC power supply operates at a frequency of approximately 375 kHz.

5. The apparatus of claim 3 wherein a rectifying circuit applies power from the AC power supply to the first power supply connection during the first portion of the AC power cycle, and power from the AC power supply to the first power supply connection and the second power supply connection during the second portion of the AC power cycle.

6. The apparatus of claim 1 wherein the vacuum chamber is electrically grounded.

* * * * *